(12) United States Patent
Mizuno et al.

(10) Patent No.: US 9,357,642 B2
(45) Date of Patent: May 31, 2016

(54) CIRCUIT BOARD LAMINATE AND METAL-BASED CIRCUIT BOARD

(71) Applicants: Katsumi Mizuno, Yokohama (JP); Kazuhiko Konomi, Yokohama (JP); Yutaka Natsume, Yokohama (JP); Ryo Miyakoshi, Tsukuba (JP); Takeshi Kondo, Tsukuba (JP)

(72) Inventors: Katsumi Mizuno, Yokohama (JP); Kazuhiko Konomi, Yokohama (JP); Yutaka Natsume, Yokohama (JP); Ryo Miyakoshi, Tsukuba (JP); Takeshi Kondo, Tsukuba (JP)

(73) Assignees: NHK SPRING CO., LTD., Kanagawa (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 443 days.

(21) Appl. No.: 13/685,972

(22) Filed: Nov. 27, 2012

(65) Prior Publication Data

US 2013/0081865 A1 Apr. 4, 2013

Related U.S. Application Data

(63) Continuation of application No. PCT/JP2011/061167, filed on May 16, 2011.

(30) Foreign Application Priority Data

May 27, 2010 (JP) ................... 2010-121940

(51) Int. Cl.
*H05K 1/03* (2006.01)
*B32B 15/04* (2006.01)
*H05K 1/05* (2006.01)

(52) U.S. Cl.
CPC .............. *H05K 1/0373* (2013.01); *B32B 15/04* (2013.01); *H05K 1/056* (2013.01);

(Continued)

(58) Field of Classification Search
CPC ........................................................ H05K 1/03
USPC .......................................................... 174/258
See application file for complete search history.

(56) References Cited

U.S. PATENT DOCUMENTS 6,479,760 B2* 11/2002 Kimbara et al. ............... 174/260
2003/0181560 A1* 9/2003 Kawaguchi ............. B32B 15/08
524/424

(Continued)

FOREIGN PATENT DOCUMENTS

| CN | 1893803 A | 1/2007 |
| CN | 1903564 A | 1/2007 |

(Continued)

OTHER PUBLICATIONS

International Preliminary Report on Patentability (IPRP) dated Dec. 13, 2012 (in English) issued in parent International Application No. PCT/JP2011/061167.

(Continued)

*Primary Examiner* — Jenny L Wagner
*Assistant Examiner* — Michael P McFadden
(74) *Attorney, Agent, or Firm* — Holtz, Holtz & Volek PC (57) ABSTRACT

A circuit board laminate includes a metal substrate, an insulation layer disposed on the metal substrate, and a metal foil disposed on the insulation layer. A metal-based circuit board includes a metal substrate, an insulation layer disposed on the metal substrate, and a circuit pattern disposed on the insulation layer. The insulation layer contains a liquid crystal polyester and 50% by volume or more of an inorganic filler. The inorganic filler is made of boron nitride and at least one of aluminum nitride and aluminum oxide. A proportion of boron nitride in the inorganic filler is within a range of 35 to 80% by volume.

8 Claims, 4 Drawing Sheets

(52) U.S. Cl.
CPC .... *B32B 2457/08* (2013.01); *H05K 2201/0141* (2013.01); *H05K 2201/0209* (2013.01); *Y10T 428/31681* (2015.04)

(56) References Cited

U.S. PATENT DOCUMENTS

| | | | |
|---|---|---|---|
| 2004/0140551 A1* | 7/2004 | Usui et al. ................. | 257/700 |
| 2004/0210032 A1 | 10/2004 | Okamoto et al. | |
| 2007/0001292 A1* | 1/2007 | Ohta .................. | H01L 23/3733 257/718 |
| 2007/0026245 A1* | 2/2007 | Okamoto ................ | B32B 15/08 428/458 |
| 2012/0193131 A1 | 8/2012 | Kusakawa et al. | |

FOREIGN PATENT DOCUMENTS

| | | | |
|---|---|---|---|
| JP | 58-15290 | A | 1/1983 |
| JP | 5-167212 | A | 7/1993 |
| JP | 2002-146003 | A | 5/2002 |
| JP | 2002-220444 | A | 8/2002 |
| JP | 2005-325231 | A | 11/2005 |
| JP | 2007-106107 | A | 4/2007 |
| JP | 2009-24126 | A | 2/2009 |
| JP | 2010-98246 | A | 4/2010 |
| WO | WO 2011/037173 | A1 | 3/2011 |

OTHER PUBLICATIONS

Japanese Office Action dated Oct. 1, 2013 (and English translation thereof) in counterpart Japanese Application No. 2010-121940.
International Search Report dated Jun. 28, 2011 (in English) in counterpart International Application No. PCT/JP2011/061167.
Chinese Office Action dated Nov. 15, 2014, issued in counterpart Chinese Application No. 201180026282.7.
Chinese Office Action (and English translation thereof) dated Jun. 18, 2015, issued in counterpart Chinese Application No. 201180026282.7.
Chinese Office Action (and English translation thereof) dated Dec. 10, 2015, issued in counterpart Chinese Application No. 201180026282.7.

* cited by examiner

CIRCUIT BOARD LAMINATE AND METAL-BASED CIRCUIT BOARD

CROSS REFERENCE TO RELATED APPLICATIONS

This application is a Continuation Application of PCT Application No. PCT/JP2011/061167, filed May 16, 2011 and based upon and claiming the benefit of priority from prior Japanese Patent Application No. 2010-121940, filed May 27, 2010, the entire contents of all of which are incorporated herein by reference.

BACKGROUND OF THE INVENTION

1. Field of the Invention

The present invention relates to a circuit board laminate and a metal-based circuit board produced from the circuit board laminate.

2. Description of the Related Art

Electronics technologies have been remarkably developed in recent years and the developments of high-performance and miniaturized electrical and electronic equipment have made rapid progress. Along with this, the amount of heat generated by parts mounted with electrical elements and/or electronic elements are more increased. Such a background brings about a situation where excellent heat radiation ability besides sufficient thermal resistance is required for the metal-based circuit board that is typically equipped with so-called power devices such as MOSFETs (metal-oxide-semiconductor field-effect transistors) and IGBTs (insulated-gate bipolar transistors).

The metal-based circuit board has a structure in which an insulation layer and a circuit pattern are laminated in this order on a metal substrate. When this insulation layer is made of a mixture of a resin and an inorganic filler, a metal-based circuit board superior in heat radiation is obtained. Jpn. Pat. Appln. KOKAI Publication No. 5-167212 describes that alumina, silica, aluminum nitride, boron nitride, beryllium oxide, or a mixture of these compounds is used as an inorganic filler and an epoxy resin, phenol resin, silicon resin, or polyimide resin is used as a resin.

Jpn. Pat. Appln. KOKAI Publication No. 2005-325231 describes a resin composition obtained by filling a high heat-conductive inorganic material in a liquid crystal polyester having a specific structure. This literature describes that a mixture of two or more of materials selected from aluminum nitride, boron nitride, aluminum oxide, and the like may be used as the heat-conductive inorganic material. This literature also describes that this resin composition can be used as encapsulants for semiconductors, resistors, capacitors, etc., raw materials for electrical and electronic parts such as substrates and housings, or construction materials for equipment such as heat exchangers and bearings.

BRIEF SUMMARY OF THE INVENTION

The circuit board laminate to be used in a circuit board is desired to have, besides excellent heat radiation, high insulation ability and peel strength. In the case of, for example, a metal-based aluminum board mounted with a power device, its withstand voltage is preferably 4.0 kV or more taking the durability of the board into consideration. Further, the peel strength of the circuit pattern is preferably 7.0 N/cm or more taking it into account to enable processing such as cutting of the substrate and drilling into the substrate without causing any peeling of the circuit pattern.

When a resin composition containing a liquid crystal polyester and an inorganic filler is used, it is possible that a metal-based circuit board superior in heat radiation, insulation, and peel strength is obtained. However, the present inventors have found that there is a possibility that the circuit, board obtained in this manner cannot always achieve a performance as expected when the proportion of the inorganic filler in the insulation layer is increased.

It is an object of the present invention to provide a technique that is advantageous in attaining a metal-based circuit board superior in heat radiation, insulation and peel strength.

According to a first aspect of the present invention, there is provided a circuit board laminate comprising a metal substrate, an insulation layer disposed on the metal substrate and containing a liquid crystal polyester and 50% by volume or more of an inorganic filler, the inorganic filler being made of boron nitride and at least, one of aluminum nitride and aluminum oxide, wherein a proportion of boron nitride in the inorganic filler is within a range of 35 to 80% by volume, and a metal foil disposed on the insulation layer.

According to a second aspect of the present invention, there is provided a metal-based circuit board comprising a metal substrate, an insulation layer disposed on the metal substrate and containing a liquid crystal polyester and 50% by volume or more of an inorganic filler, the inorganic filler being made of boron nitride and at least one of aluminum nitride and aluminum oxide, wherein a proportion of boron nitride in the inorganic filler is within a range of 35 to 80% by volume, and a circuit pattern disposed on the insulation layer.

DETAILED DESCRIPTION OF THE INVENTION

Embodiments of the present invention will be hereinafter described in detail with reference to drawings. It should be noted that constituent elements achieving the same or similar functions are denoted with the same reference symbols throughout the drawings, and redundant explanation thereof is omitted.

As mentioned above, the present, inventors have found that in the case where a resin composition containing a liquid crystal polyester and an inorganic filler is used, there is a possibility that a performance as expected cannot be always achieved when a proportion of the inorganic filler in the insulation layer is increased. The present inventors have made earnest studies to investigate the reason and as result, found that because a liquid crystal polyester has a higher viscosity than other resins such as epoxy resins, a dispersion liquid containing the liquid crystal polyester solution and an inorganic filler tends to contain air bubbles and it is difficult to sufficiently eliminate these air bubbles from a coating film obtained from the dispersion liquid. The present inventors have also found that the porosity of an insulation layer obtained from this coating film greatly affects the performance of a circuit board laminate and the performance of a metal-based circuit board obtained from the laminate, particularly, the withstand voltage.

The present inventors have further found that the porosity of the insulation layer can be reduced by using boron nitride as at least a part of the inorganic filler. Moreover, the present inventors have found that sufficient peel strength, high withstand voltage, and low thermal resistance can be attained at the same time if a combination of at least one of aluminum nitride and aluminum oxide and boron nitride is used as the inorganic filler and a proportion of boron nitride in the inorganic filler is set within a predetermined range. The present invention has been made based on the above findings.

Figure 1:
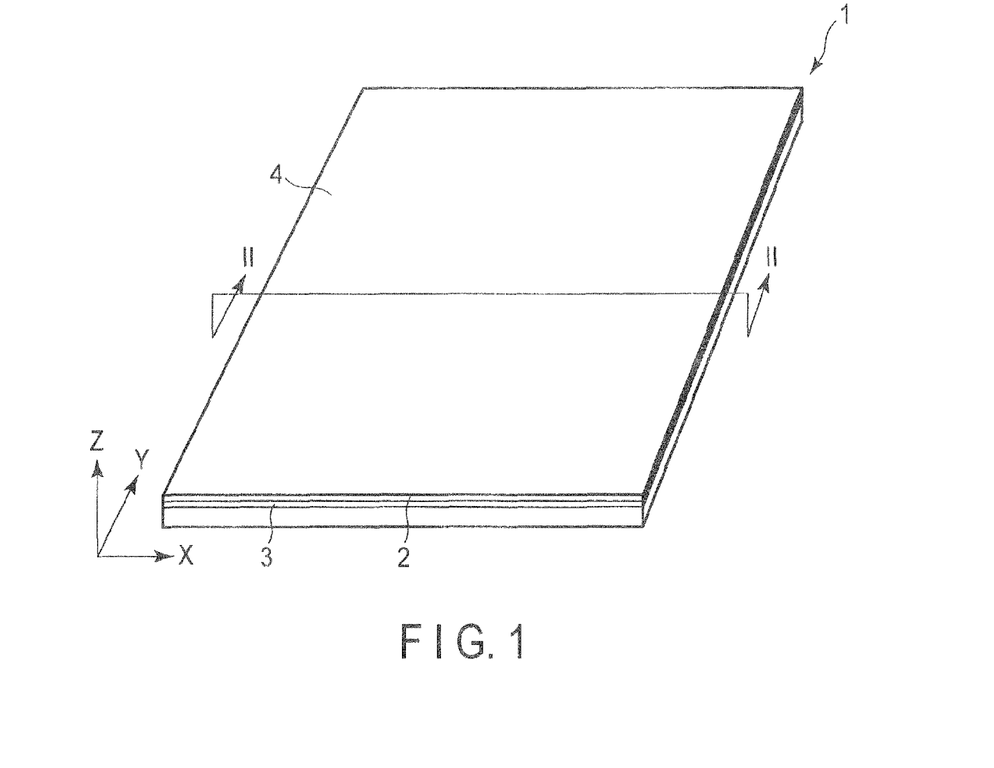
FIG. 1 is a perspective view schematically showing a circuit board laminate according to an embodiment of the present invention.
Figure 2:
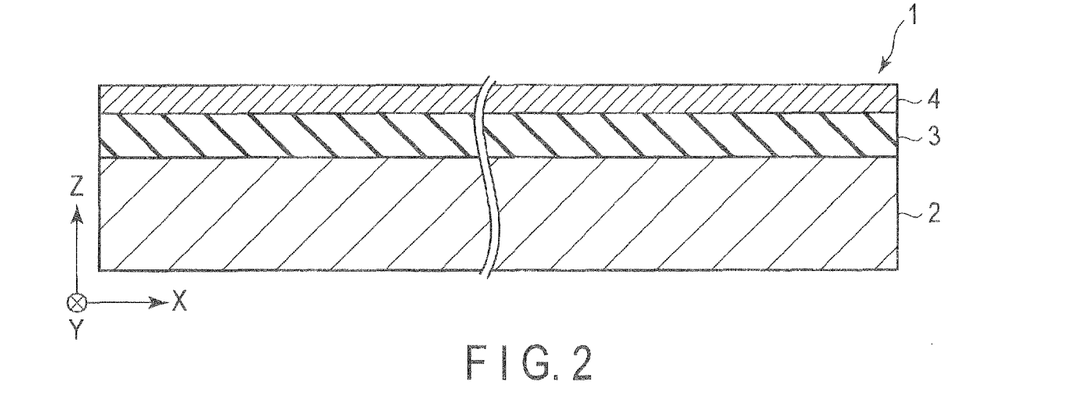
FIG. 2 is a sectional view taken along an II-II line of the circuit board laminate shown in FIG. 1.

FIG. 1 is a perspective view schematically showing a circuit board laminate according to an embodiment of the present invention. FIG. 2 is a sectional view taken along an II-II line of the circuit board laminate shown in FIG. 1.

The circuit board laminate 1 shown in FIGS. 1 and 2 includes a metal substrate 2, an insulation layer 3, and a metal foil 4. In FIGS. 1 and 2, X and Y directions are parallel to the main surface of the metal substrate 2 and orthogonal to each other, and Z direction is a thickness direction orthogonal to the X and Y directions. Though the rectangular circuit board laminate 1 is drawn as an example in FIG. 1, the circuit board laminate may have other shapes.

The metal substrate 2 is made of, for example, a single element metal or alloy. For example, aluminum, iron, copper, aluminum alloy, or stainless may be used as the material of the metal substrate 2. The metal substrate 2 may further contain nonmetals such as carbon. For example, the metal substrate 2 may contain aluminum composited with carbon. The metal substrate 2 may have a single layer structure or a multilayer structure.

The metal substrate 2 has a high thermal conductivity. The metal substrate 2 has, typically, a thermal conductivity of 60 $W \cdot m^{-1} \cdot K^{-1}$ or more.

The metal substrate 2 may or may not have flexibility. The thickness of the metal substrate 2 is, for example, within a range of 0.2 to 5 mm.

The insulation layer 3 is disposed on the metal substrate 2. The insulation layer 3 contains a liquid crystal polyester and an inorganic filler.

The liquid crystal polyester has a function as a binder that binds the inorganic fillers together and a function as an adhesive that bonds a metal foil 4 to the metal substrate 2. Moreover, the liquid crystal polyester has a function of flattening the surface of the insulation layer 3.

The liquid crystal polyester is an electrically insulating material. The liquid crystal polyester has a greater specific resistance than many other resins.

A proportion of the liquid crystal polyester in the insulation layer 3 is, for example, within a range of 20 to 50% by volume and typically within a range of 35 to 50% by volume. When this proportion is unduly decreased, the adhesive strength among inorganic fillers is reduced, the adhesive strength between the insulation layer 3 and the metal substrate 2 or metal foil 4 is reduced, or it becomes difficult to flatten the surface of the insulation layer 3. When the proportion is unduly increased, the withstand voltage of the circuit board laminate 1 is lowered or the thermal resistance of the circuit board laminate 1 increases.

The liquid crystal polyester typically has thermoplasticity. As the liquid crystal polyester, for example, one which exhibits optical anisotropy when it is melted and forms an anisotropic melt at a temperature of 450° C. or less may be used. As such a liquid crystal polyester, for example, one having the structural units represented by the following formulae (1) to (3) may be used.

In the following formulae (1) to (3), Ar1 represents, for example, a phenylene group or a naphthylene group, Ar2 represents a phenylene group, a naphthylene group, or a group represented by the following formula (4), Ar3 represents a phenylene group or a group represented by the following formula (4), and X and Y independently represent O or NH. Each hydrogen atom bonded to the aromatic ring of Ar, Ar2, or Ar3 may be substituted with, for example, a halogen atom, alkyl group, or aryl group. Further, in the following formula (4), Ar11 and Ar12 independently represent, for example, a phenylene group or a naphthylene group, and Z represents, for example, O, CO, or $SO_2$.

(1)

(2)

(3)

(4)

In this liquid crystal polyester, a proportion of the structural unit represented by the above formula (1) is, for example, within a range of 30 to 80 mol % based on a total of the structural units represented by the above formulae (1) to (3). In this case, a proportion of the structural unit represented by the above formula (2) is, for example, within a range of 10 to 35 mol % based on the total of the structural units represented by the above formulae (1) to (3). Then, proportion of the structural unit represented by the above formula (3) is, for example, within a range of 10 to 35 mol % based on the total of the structural units represented by the above formulae (1) to (3).

In this liquid crystal polyester, the proportion of the structural unit represented by the above formula (1) may be within a range of 30 to 45 mol % based on the total of the structural units represented by the above formulae (1) to (3). In this case, the proportion of the structural unit represented by the above formula (2) may be within a range of 27.5 to 35 mol % based on the total of the structural units represented by the above formulae (1) to (3). Then, the proportion of the structural unit represented by the above formula (3) may be within a range of 27.5 to 35 mol % used on the total of the structural units represented by the above formulae (1) to (3).

The liquid crystal polyester preferably contains at least one structural unit (a) selected from the group consisting of a structural unit derived from an aromatic diamine and a structural unit derived from an aromatic amine having a hydroxyl group, in an amount range of 27.5 to 35.0 mol % based on all structural units. Particularly, a liquid crystal polyester having the structural unit (a) as the structural unit represented by the above formula (3) tends to well produce the above effect, that is, the effect that "it exhibits optical anisotropy when it is melted and forms an isotropic melt at a temperature of 450° C. or less".

The structural unit represented by the formula (1) is a structural unit derived from an aromatic hydroxycarboxylic acid, the structural unit represented by the formula (2) is a structural unit derived from an aromatic dicarboxylic acid, and the structural unit represented by the formula (3) is a structural unit derived from an aromatic amine having an aromatic diamine or phenolic hydroxyl group. The above liquid crystal polyester is obtained by using compounds from which the structural units (1) to (3) are derived as monomers and by polymerizing these monomers.

Note that in place of the above-described monomers, their ester-forming derivatives or amide-forming derivatives may be used from the viewpoint of facilitating the progress of a polymerization reaction to obtain this liquid crystal polyester.

Examples of the carboxylic acid-based ester-forming derivatives or amide-forming derivatives include, compounds in which carboxyl group is converted into a derivative having high reaction activity such as an acid chloride and acid anhydride so that a reaction for producing a polyester or polyamide is promoted, and compounds in which carboxyl group is combined with alcohols, ethylene glycol, etc. to form an ester so that polyesters or polyamides are produced by ester interchange reaction or amide interchange reaction.

Examples of the phenolic hydroxyl group-based ester-forming derivatives or amide-forming derivatives include compounds in which phenolic hydroxyl group is combined with carboxylic acids to form an ester so that a polyester or polyamide is produced by an ester interchange reaction.

Examples of the amino group-based amide-forming derivatives include compounds in which amino group is combined with carboxylic acids to form an ester so that polyamide is produced by an amide interchange reaction.

Specifically, the following units may be given as examples of the structural units represented by the above structural units (1) to (3). However, the a structural units represented by the above structural units (1) to (3) are not limited to the following examples.

Examples of the structural unit represented by the formula (1) include structural units derived from aromatic hydroxycarboxylic acids selected from p-hydroxybenzoic acid, 2-hydroxy-6-naphthoic acid, and 4-hydroxy-4'-biphenylcarboxylic acid. The liquid crystal polyester may contain only one type or two or more types among these structural units. Particularly, it is preferable to use an aromatic liquid crystal polyester having either a structural unit derived from p-hydroxybenzoic acid or a structural unit derived from 2-hydroxy-6-naphthoic acid.

The proportion of the structural unit represented by the formula (1) based on a total of all structural units is, for example, within a range of 30.0 to 45.0 mol % and preferably within a range of 35.0 to 40.0 mol %.

If the proportion of the structural unit represented by the formula (1) in the total structural units is increased, the solubility of the liquid crystal polyester in an aprotic solvent which will be described later is deteriorated. When this proportion is small, there is a tendency that the polyester has no liquid crystal property.

Examples of the structural unit represented by the formula (2) include structural units derived from aromatic dicarboxylic acids selected from terephthalic acid, isophthalic acid, and 2,6-naphthalenedicarboxylic acid. The liquid crystal polyester may contain only one type or two or more types among these structural units. Especially, it is preferable to use a liquid crystal polyester having a structural unit derived from isophthalic acid from the viewpoint of the solubility of the liquid crystal polyester in an aprotic solvent which will be described later.

The proportion of the structural units represented by the formula (2) based on a total of all structural units is, for example, within a range of 27.5 to 35.0 mol % and preferably within a range of 30.0 to 32.5 mol %.

If the proportion of the structural unit represented by the formula (2) in the total structural units is increased, the liquid crystal property of the polyester tends to be deteriorated. When this proportion is small, the solubility of the polyester in an aprotic solvent tends to be deteriorated.

Examples of the structural unit represented by the formula (3) include structural units derived from aromatic amines having a phenolic hydroxyl group such as 3-aminophenol and 4-aminophenol, and structural units derived from aromatic diamines such as 1,4-phenylenediamine and 1,3-phenylenediamine. The liquid crystal polyester may contain either only one type or two or more types among these structural units. In particular, it is preferable to use a liquid crystal polyester having a structural unit derived from 4-aminophenol from the viewpoint of the polymerization reaction run in the production of the liquid crystal polyester.

The proportion of the structural unit represented by the formula (3) based on a total of all structural units is, for example, within a range of 27.5 to 35.0 mol % and preferably within a range of 30.0 to 32.5 mol %.

When the proportion of the structural unit represented by the formula (3) in the total structural units is increased, the liquid crystal property of the polyester tends be deteriorated. When this proportion is decreased, the solubility of the liquid crystal polyester in an aprotic solvent tends to be deteriorated.

The amount of the structural unit represented by the formula (3) is preferably equal to the amount of the structural unit represented by the formula (2). When the difference between the proportion of the structural unit represented by the formula (3) in the total structural units and the proportion of the structural unit represented by the formula (2) in the total structural units is designed to be within a range of −10 to +10 mol %, the degree of polymerization of the aromatic liquid crystal polyester can be controlled.

No particular limitation is imposed on the method of producing the above liquid crystal polyester. Given as examples of the method of producing the liquid crystal polyester are a method in which an aromatic hydroxycarboxylic acid corresponding to the structural unit represented by the formula (1) and a phenolic hydroxyl group or amino group of an aromatic amine or aromatic diamine having a hydroxyl group corresponding to the structural unit represented by the formula (3) are treated with excess fatty acid anhydride to undergo acylation and the obtained acylated product (ester-forming derivative or amide-forming derivative) and an aromatic dicarboxylic acid corresponding to the structural unit represented by the formula (2) are made to enter into ester interchange reaction (polycondensation) to undergo melt polymerization.

As the above acylated product, a fatty acid ester obtained by acylating in advance may be used (see, for example, Jpn. Pat. Appln. KOKAI Publication No. 2002-220444 and Jpn. Pat. Appln. KOKAI Publication No. 2002-146003).

In the above acylation reaction, the amount of the fatty acid anhydride to be added is preferably 1.0 to 1.2 equivalents and more preferably 1.05 to 1.1 equivalents to the total amount of the phenolic hydroxyl group and amino group.

When the amount of the fatty acid anhydride to be added is small, the reaction system tends to be clogged because the acylated product, raw monomers, and the like are sublimated during ester interchange reaction (polycondensation). When the amount of the fatty acid anhydride to be added is large, there is a tendency that the obtained aromatic liquid crystal polyester is significantly colored.

The above acylation reaction is run preferably at 130 to 180° C. for 5 min to 10 hr and more preferably at 140 to 160° C. for 10 min to 3 hr.

There is no particular limitation to the fatty acid anhydride to be used in the above acylation reaction. Examples of the fatty acid anhydride include acetic acid anhydride, propionic acid anhydride, butyric acid anhydride, isobutyric acid anhydride, valeric acid anhydride, pivalic acid anhydride, 2ethyl hexanoic acid anhydride, monochloroacetic acid anhydride, dichloroacetic acid anhydride, trichloroacetic acid anhydride, monobromoacetic acid anhydride, dibromoacetic acid anhydride, tribromoacetic acid anhydride, monofluoroacetic acid anhydride, difluoroacetic acid anhydride, trifluoroacetic acid anhydride, glutaric acid anhydride, maleic acid anhydride, succinic acid anhydride, and β-bromopropionic acid anhydride. These compounds may be used either singly or in combinations of two or more.

Among these compounds, acetic acid anhydride, propionic acid anhydride, butyric acid anhydride, and isobutyric acid anhydride are preferable and acetic acid anhydride is more preferable from the viewpoint of cost and handleability.

In the above ester interchange and amide interchange reactions, the amount of the acyl group of the acylated product is preferably 0.8 to 1.2 equivalents to the carboxyl group.

Further, the above ester interchange and amide interchange reactions are run preferably at 130 to 400° C. at a temperature rise rate of 0.1 to 50° C./min and more preferably at 150 to 350° C. at a temperature rise rate of 0.3 to 5° C./min.

When performing the above ester interchange and amide exchange between the fatty acid ester obtained by acylation and carboxylic acid or amine, by-produced fatty acid and unreacted fatty acid anhydride are preferably removed from the system by vaporization or the like in order to cause the equilibrium shift.

The acylation reaction, the ester interchange reaction and amide interchange reaction may be run in the presence of a catalyst. As this catalyst, for example, a catalyst generally used as a polyester polymerization catalyst may be used. Examples of such a catalyst include metal salt catalysts such as magnesium acetate, stannous acetate, tetrabutyl titanate, lead acetate, sodium acetate, potassium acetate, and antimony trioxide, and organic compound catalysts such as N,N-dimethylaminopyridine and N-methylimidazole.

Among the above catalysts, heterocyclic compounds having two or more nitrogen atoms such as N,N-dimethylaminopyridine and N-methylimidazole are preferably used (see Jpn. Pat. Appln. KOKAI Publication No. 2002-146003).

The above catalyst is usually introduced when introducing monomers. This catalyst may be removed or not removed after acylation. When this catalyst is not removed, the ester interchange reaction may be run in succession to the acylation reaction.

Although the polymerization by the above ester interchange and amide interchange reactions is usually carried out by melt polymerization, a combination of melt polymerization and solid phase polymerization may be adopted. The solid phase polymerization may be carried out by withdrawing a polymer produced in a melt polymerization process, milling this polymer into a powder or flake form, and then, carrying out a known solid phase polymerization method. Specific examples include a method in which a heat treatment is performed in a solid state at 20 to 350° C. for 1 to 30 hr in an inert gas (nitrogen or the like) atmosphere. The solid phase polymerization may be carried out either with stirring or stationarily without stirring.

It is to be noted that if an appropriate stirring mechanism is installed, melt polymerization and solid phase polymerization can be carried out in the same reaction vessel.

After the solid phase polymerization, the obtained liquid crystal polyester may be formed into, for example, pellets by a known method.

The above liquid crystal polyester can be manufactured using a batch system and/or continuous system.

With regard to the above liquid crystal polyester, its flow start temperature determined by the following method is preferably 250° C. or more and more preferably 260° C. or more. The use of such a liquid crystal polyester enables higher adhesiveness between the insulation layer 3 and the metal foil 4, and between the insulation layer 3 and the metal substrate 2 as compared to the use of a liquid crystal polyester having a lower flow start temperature.

Further, the above polyester preferably has a flow start temperature of 300° C. or less and more preferably 290° C. or less. Such a liquid crystal polyester tends to have higher solubility in a solvent as compared with a liquid crystal polyester having a higher flow start temperature.

Here, the term "flow start temperature" means the lowest temperature at which the melt viscosity of such an aromatic polyester is 4800 Pa·s or less under a pressure of 9.8 MPa in the evaluation of the melt viscosity by a flow tester.

According to a literature published in 1987 "Liquid Crystal PolymerSynthesis•Molding•Application" (Edited by KOIDE Naoyuki, pp 95-105, CMC, published on Jun. 5, 1987), the term "flow temperature" (same as the term "flow start temperature" used in this specification) has been used as an index of the molecular weight of a liquid crystal polyester resin since a liquid crystal polyester resin was developed in the 1970s.

The flow start temperature of the above liquid crystal polyester can be easily controlled, for example, by withdrawing a polymer produced in a melt polymerization process, milling the polymer into a powder or flake form, and then regulating the flow start temperature of the polymer by a known solid phase polymerization method.

More specifically, it can be obtained, for example, by a method in which a heat treatment is performed in a solid phase state at a temperature exceeding 210° C. and preferably at 220 to 350° C. for 1 to 10 hr in an atmosphere of inert gas such as nitrogen after the melt polymerization process. The solid phase polymerization may be carried out either with stirring or stationarily without stirring. For example, solid phase polymerization may be performed at 225° C. for 3 hr in an atmosphere of inert gas such as nitrogen stationarily without stirring.

The inorganic filler is distributed over the entire insulation layer 3. The inorganic filler has a higher thermal conductivity than the liquid crystal polyester.

The proportion of the inorganic filler in the insulation layer 3 is, for example, within a range of 50 to 80% by volume and typically within a range of 50 to 65% by volume. If this proportion is unduly decreased, the thermal resistance increases or withstand voltage drops. If this proportion is unduly increased, the adhesive strength among inorganic fillers is weakened, or the adhesive strength between the insulation layer 3 and the metal substrate 2 or metal foil 4 is weakened, or it becomes difficult to flatten the surface of the insulation layer 3.

The inorganic filler is made of boron nitride and at least one of aluminum nitride and aluminum oxide. Each of these components is distributed almost uniformly over the entire insulation layer 3.

Aluminum nitride and aluminum oxide are used, for example, in the form of almost globular particles. In the insulation layer 3, aluminum nitride and aluminum oxide may be distributed in the form or either primary particles or secondary particles. Alternatively, in the insulation layer 3, a part of aluminum nitride and aluminum oxide may be distributed in the form of primary particles and the remainder of aluminum nitride and aluminum oxide may be distributed in the form of secondary particles.

The average particle diameter of aluminum nitride and aluminum oxide is, for example, within a range of 5 to 30 µm. Here, the term "average particle diameter" means an average particle diameter of particles measured by the laser diffraction scattering method.

The proportion of the total amount of aluminum nitride and/or aluminum oxide in the inorganic filler is within a range of 20 to 65% by volume and typically within a range of 20 to 50% by volume. When this proportion is unduly great, it is difficult to obtain the insulation layer 3 having reduced number of pores and it is difficult to attain high withstand voltage and small thermal resistance. When this proportion is unduly small, it is difficult to obtain a circuit board laminate 1 and metal-based circuit board 1' having high peel strength.

Boron nitride is used, for example, in the form of particles having a scale form or plate form. In the insulation layer 3, boron nitride may be distributed in the form of primary particles having a scale or plate form. Alternatively, in the insulation layer 3, boron nitride may be distributed in the form of secondary particles formed by coagulating scale or plate primary particles such that the normal directions of these particles are oriented at random. Typically, in the insulation layer 3, a part of boron nitride is distributed in the form of scale or plate primary particles and other part of boron nitride is distributed in the form of the above secondary particles.

The average particle diameter of boron nitride is, for example, within a range of 10 to 50 µm. This average particle diameter is obtained in the same method as that mentioned for aluminum nitride and aluminum oxide.

As at least a part of the inorganic filler, an organic filler which is surface-treated may be used to improve the adhesion to the liquid polyester and to improve the dispersibility thereof in a dispersion liquid which will, be described later. Examples of a surface treating agent usable for this surface treatment include a silane coupling agent, titanium coupling agent, aluminum or zirconium-based coupling agent, long-chain fatty acid, isocyanate compound, and polar polymers or reactive polymers containing, for example, an epoxy group, methoxysilane group, amino group, or hydroxyl group.

The proportion of boron nitride in the inorganic filler is within a range of 35 to 80% by volume and typically within a range of 50 to 80% by volume. When this proportion is unduly great, it is difficult to obtain a circuit board laminate 1 and metal-based circuit board 1' having high peel strength. When this proportion is unduly small, it is difficult to obtain an insulation layer 3 having reduced pores and it is also difficult to achieve high withstand voltage and small thermal resistance.

The metal foil 4 is disposed on the insulation layer 3. The metal foil 4 faces the metal substrate 2 with the insulation layer 3 interposed therebetween.

The metal foil 4 is made of a single element metal or an alloy. As the material of the metal foil 4, for example, copper or aluminum may be used. The thickness of the metal foil 4 is, for example, within a range of 10 to 500 µm.

This circuit board laminate 1 is produced, for example, by the following method.

First, the aforementioned liquid crystal polyester is dissolved in a solvent to obtain an optically isotropic solution.

As the liquid crystal polyester, one having a relatively small molecular weight is preferably used in consideration of solubility in the solvent. Note that a thermoplastic resin such as an epoxy resin changes with time during storing. On the other hand, the liquid crystal polyester is thermoplastic and therefore not changes with time. Accordingly, the liquid crystal polyester can be used as industrial products without anxiety.

As the above solvent, an aprotic solvent containing no halogen atom is preferably used. Examples of such an aprotic solvent include ether type solvents such as diethyl ether, tetrahydrofuran, and 1,4-dioxane; ketone type solvents such as acetone and cyclohexane; ester type solvents such as ethyl acetate; lactone type solvents such as γ-butyrolactone; carbonate type solvents such as ethylene carbonate and propylene carbonate; amine type solvents such as triethylamine and pyridine; nitrile type solvents such as acetonitrile and succinonitrile; amide type solvents such as N,N-dimethylformamide, N,N-dimethylacetamide, tetramethylurea, and N-methylpyrrolidone; nitro type solvents such as nitromethane and nitrobenzene; sulfide type solvents such as dimethylsulfoxide and sulfolane; and phosphoric acid type solvents such as hexamethylphosphoric acid amide and tri-n-butylphosphoric acid.

Among these solvents, solvents having a dipole moment of 3 to 5 are preferable from the viewpoint of the solubility of the aforementioned liquid crystal polyester. Specifically, amide type solvents such as N,N-dimethylformamide, N,N-dimethylacetamide, tetramethylurea, and N-methylpyrrolidone, and lactone type solvents such as γ-butyrolactone are preferable, and N,N-dimethylformamide, N,N-dimethylacetamide, and N-methylpyrrolidone (NMP) are particularly preferable. Moreover, when a highly volatile solvent, having a boiling point of 180° C. or less at 1 atm is used, the solvent is easily removed from a coating film formed from a dispersion liquid containing the liquid crystal polyester and inorganic filler, after this coating film is formed. N,N-dimethylformamide (DMF) and N,N-dimethylacetamide (DMAc) are particularly preferable.

This dispersion liquid contains the liquid crystal polyester, for example, in an amount of 10 to 50 parts by mass and preferably 20 to 40 parts by mass based on 100 parts by mass of the aprotic solvent. When the amount of the liquid crystal polyester is unduly small, a large amount of solvent must be removed from the coating film. This easily causes inferior appearance of the coating film. When the amount of the liquid crystal polyester is unduly large, the aforementioned solution or dispersion liquid tends to be thickened, leading to deteriorated handleability.

Next, the above inorganic filler is dispersed in the above solution to obtain a dispersion liquid containing the polyester and inorganic filler. The inorganic filler may be dispersed in the above solution while milling with use of a ball mill, three-role mill, centrifugal stirrer, or bead mill. Additives, for example, a coupling agent such as a silane coupling agent and titanium coupling agent and ion adsorbing agent may be added in this solution prior to addition of the inorganic filler to the above solution.

Next, this dispersion liquid is applied to the surface of at least one of the metal substrate 2 and metal foil 4. The dispersion liquid may be applied, for example, by utilizing the roll coating method, bar coating method, or screen printing method. The application may be carried out by a continuous system or single-plate system.

After drying the coating film as needed, the metal substrate 2 and the metal foil 4 are laid on top of the other such that they face each other with the coating film interposed therebetween. Further, these parts are pressed under heating. A circuit board laminate 1 is thus obtained.

In this method, the coating film containing the liquid crystal polyester is subjected to heating process. When the liquid crystal polyester is heated, its molecular weight is increased and the coating film is hardened. The insulation layer 3 obtained in this manner has excellent mechanical strength.

Moreover, because the liquid crystal polyester is thermoplastic, the degree of orientation of mesogen can be sufficiently increased after the coating film is dried. Specifically, the phonon conduction path length can be increased, resulting in remarkably improved thermal conductivity.

Further, because primary particles of boron nitride typically have scale form or plate form, a part of primary particles of boron nitride change their azimuths when the coating film after dried is heated and pressure is applied to the coating film in the condition that the liquid crystal polyester is capable of flowing. This promotes the movements of air bubbles, liquid crystal polyester, aluminum nitride, and aluminum oxide, so that insulation layer 3 which is dense and has reduced air bubbles is obtained.

Further, when at least a part of boron nitride exists in the form of secondary particles formed by coagulating scale or plate primary particles such that the normal directions of these particles are oriented at random in the coating film before pressure is applied, at least a part of the primary particles included in the secondary particles are oriented such that each main surface is orthogonal or diagonal to the surface of the underlayer on which the coating film is formed. When pressure is applied to the coating film, a part of primary particles oriented in a direction orthogonal or diagonal to the undercoat surface of the coating film chance their azimuths, but not all of them change their azimuths. Further, primary particles which are oriented in a direction parallel to the surface of the underlayer are only a part of the primary particles which change their azimuths. Specifically, in the coating film after pressure is applied, at least a part of primary particles of boron nitride is oriented in a direction orthogonal or diagonal to the surface of the underlayer on which the coating film is formed. The insulation layer 3 in which primary particles of boron nitride are oriented like this has higher thermal conductivity in the Z-direction as compared with an insulation layer 3 in which primary particles of boron nitride are oriented in a direction perpendicular to the Z-direction. In other words, if boron nitride is made to exist in the aforementioned form, a circuit board laminate 1 having a higher performance can be obtained.

Next, a metal-based circuit board 1' obtained from the aforementioned circuit board laminate 1 will be described.

Figure 3:
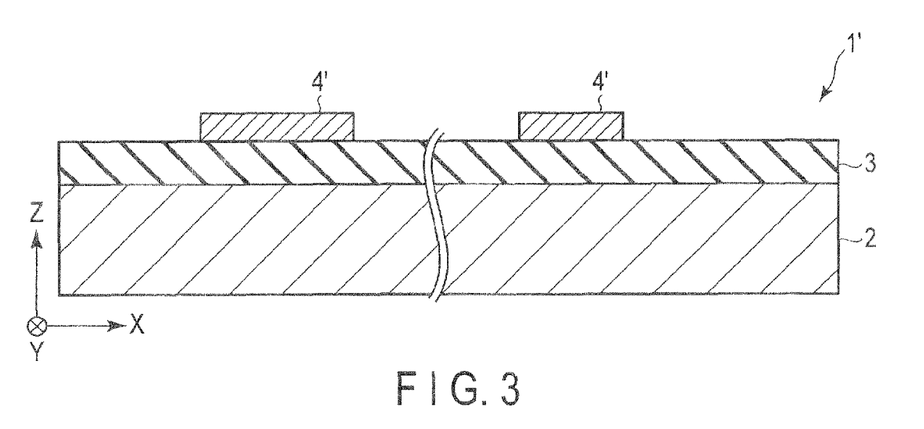
FIG. 3 is a sectional view schematically showing an example of a metal-based circuit board obtained from the circuit board laminate shown in FIGS. 1 and 2.

FIG. 3 is a sectional view schematically showing an example of the metal-based circuit board 1' obtained from the circuit board laminate 1 shown in FIGS. 1 and 2.

The metal-based circuit board 1' shown in FIG. 3 includes the metal substrate 2, the insulation layer 3, and a circuit pattern 4'. The circuit pattern 4' is obtained by the patterning of the metal foil 4 of the circuit board laminate 1 explained with reference to FIGS. 1 and 2. This patterning is carried out, for example, by forming a mask pattern on the metal foil 4 and removing the exposed portion of the metal foil 4 by etching. The metal-based circuit board 1' can be obtained, for example, by patterning the metal foil 4 of the above circuit board laminate 1 and further carrying out processing such as cutting and drilling processing, if necessary.

Since a metal-based circuit board 1' is obtained from the aforementioned circuit board laminate 1, it is superior in heat radiation and thermal resistance. In addition, the circuit pattern 4' has sufficient peel strength despite the fact that the proportion of the inorganic filler in the insulation layer 3 is high.

Examples of the present invention will be described below.

<Production of a Liquid Crystal Polyester>

A reactor equipped with a stirrer, torque meter, nitrogen gas introduction pipe, temperature gauge, and reflux condenser was charged with 1,976 g (10.5 mol) of 2-hydroxy-6-naphthoic acid, 1,474 g (9.75 mol) of 4-hydroxyacetanilide, 1,620 g (9.75 mol) of isophthalic acid, and 2,374 g (23.25 mol) of acetic acid anhydride. After the atmosphere in the reactor was sufficiently replaced with nitrogen, 15 minutes were spent to heat the mixture to 150° C. in a nitrogen gas stream and then refluxed at this temperature for 3 hours.

After that, 170 minutes were spent to raise the temperature in the reactor to 300° C. while distilling byproduct acetic acid and unreacted acetic acid anhydride away. A rise of torque was regarded to be the end of the reaction and then, the content was withdrawn. The withdrawn content was cooled to ambient temperature and then milled by a milling machine to obtain powder of a liquid crystal polyester having a relatively low-molecular weight.

Measurement using a Flow Tester CFT-500 manufactured by Shimadzu Corporation was performed on the obtained powder, and obtained a result that the flow start temperature was 235° C. Further, this liquid crystal polyester powder was heat-treated at 223° C. for 3 hours in a nitrogen atmosphere to cause solid-phase polymerization. The flow start temperature of the liquid crystal polyester after the solid-phase polymerization was 270° C.

<Preparation of a Liquid Crystal Polyester Solution>

2,200 g of the liquid crystal polyester obtained in the above method was added to 7,800 g of N,N-dimethylacetamide (DMAc), which was then heated at 100° C. for 2 hours to obtain a liquid crystal polyester solution. This solution had a viscosity of 320 cP. This viscosity was a value measured at 23° C. using a B-type viscometer ("TVL-20 Model", rotor No. 21 (rotation: 5 rpm) manufactured by TOKI SANGYO CO., LTD.).

EXAMPLE 1

Aluminum nitride ("FAN-f30", manufactured by Furukawa Electric Co., Ltd., average particle diameter: 30 μm) was added to the liquid crystal polyester solution obtained by the above method to prepare a dispersion liquid. Here, aluminum nitride was added such that the proportion of the inorganic filler made of aluminum nitride in the insulation layer obtained from this dispersion liquid was 65% by volume.

After this dispersion liquid was stirred for 5 minutes by a centrifugal stirring defoamer, it was applied to a 70-μm-thick copper foil in a thickness of about 130 μm. Then, this coating film was dried at 100° C. for 20 minutes and then heat-treated at 30° C. for 3 hours.

Next, the metal substrate and the above copper foil were laid on top of another with the coating film sandwiched therebetween. Here, as the metal substrate, an aluminum alloy substrate was used which had a thermal conductivity of 140 $W \cdot m^{-1} \cdot K^{-1}$ and a thickness of 2.0 mm. Then, the laminated materials were heat-treated at 340° C. with applying pressure of 20 MPa for 20 minutes to thermally bind these materials with each other.

At this time, the thickness D1 of the coating film measured before pressure was applied and the thickness D2 of the coating film after thermal binding, that is, the insulation layer were measured to calculate the difference (D1−D2) between the thicknesses D2 and D1. Then, the ratio (D1−D2/D1 of the difference (D1−D2) to the difference D1 was calculated as compressibility. As a result, the compressibility was 14.6%.

Further, assuming the foam content to be zero, the thickness D2' of the insulation layer was calculated based on the composition of the dispersion liquid and the coating amount per unit area. Then, the ratio (D2−D2')/D2 of the difference (D2−D2') between the thicknesses D2 and D2' to the thickness D2 was calculated as porosity. As a result, the porosity was 20.0%.

Then, the circuit board laminate obtained in the above manner was used to measure withstand voltage, T-peel strength, and thermal resistance in the following conditions, respectively.

Withstand Voltage:

The circuit board laminate cut into a predetermined dimension was dipped in insulation oil to apply AC voltage to the copper foil at ambient temperature. The voltage to be applied was raised to find the minimum dielectric breakdown voltage as the withstand voltage.

T-Peel Strength Test:

The copper foil of the circuit board laminate cut into a predetermined dimension was partially removed by etching to form a copper foil pattern having a width of 10 mm. One end of the copper foil was gripped and force was applied such that the peeled portion of the copper foil pattern was orthogonal to the main surface of the metal substrate to peel off the foil pattern from the metal substrate at a rate of 50 mm/min. At this time, the force applied to the copper foil pattern was defined as T-peel strength.

Thermal Resistance:

The copper foil of the circuit board laminate cut into a dimension of 30 mm×40 mm was partially removed by etching to form a 14 mm×10 mm land. After a transistor (C2233) was attached to this land by using a solder, the circuit board laminate was set to a water-cooler in such a manner that the metal substrate faces the cooling surface of the cooler through a silicone grease layer. Then, a power P of 30 W was supplied to the transistor to measure the temperature T1 of the transistor and temperature T2 of the cooling surface of the cooler. The difference (T1−T2) between the temperatures T1 and T2 obtained in this manner was calculated and the ratio (T1−T2)/P of the difference (T1−T2) to the power P was defined as thermal resistance.

Each measurement was made in the following condition to find that the withstand voltage was 1.5 kV, T-peel strength was 13.6 N/cm, and thermal resistance was 0.20° C./W.

EXAMPLE 2

The same aluminum nitride as that used in Example 1 and boron nitride ("HP-40", manufactured by MIZUSHIMA FERROALLOY CO., LTD., average particle diameter: 20 μm) were added to the liquid crystal polyester solution obtained by the above method to prepare a dispersion liquid. Here, aluminum nitride, and boron nitride were added such that the proportion of the inorganic filler made of aluminum nitride and boron nitride in the insulation layer obtained from this dispersion liquid was 65% by volume and the proportion (hereinafter, referred to as "BN blend ratio") of boron nitride in the inorganic filler was 25% by volume.

A circuit board laminate was produced in the same method as in Example 1 except that the dispersion liquid prepared as mentioned above was used. In this case, the compressibility and porosity were also measured in the same methods as in Example 1. As result, the compressibility and porosity were 18.0% and 10.8%, respectively.

Further, the withstand voltage, T-peel strength, and thermal resistance were measured in the same methods as in Example 1 except that this circuit board laminate was used. As a result, the withstand voltage was 2.0 kV, peel strength was 13.1 N/cm, and thermal resistance was 0.18° C./W.

EXAMPLE 3

A circuit board laminate was produced in the same method as in Example 2 except that the BN blend ratio was 35% by volume. In this case, the compressibility and porosity were also measured in the same methods as in Example 1. As a result, the compressibility and porosity were 20.0% and 7.0%, respectively.

Further, the withstand voltage, T-peel strength, and thermal resistance were measured in the same methods as in Example 1 except that this circuit board laminate was used. As a result, the withstand voltage was 4.0 kV, peel strength was 12.3 N/cm, and thermal resistance was 0.17° C./W.

EXAMPLE 4

A circuit board laminate was produced in the same method as Example 2 except that the BN blend ratio was 50% by volume. In this case, the compressibility and porosity were also measured in the same methods as in Example 1. As a result, the compressibility and porosity were 21.7% and 1.3%, respectively.

Further, the withstand voltage, T-peel strength, and thermal resistance were measured in the same methods as in Example 1 except that this circuit board laminate was used. As a result, the withstand voltage was 7.0 kV, peel strength was 11.6 N/cm, and thermal resistance was 0.16° C./W.

EXAMPLE 5

A circuit board laminate was produced in the same method as Example 2 except that she BN blend ratio was 80% by volume. In this case, the compressibility and porosity were also measured in the same methods as in Example 1. As a result, the compressibility and porosity were 29.0% and 0.5%, respectively.

Further, the withstand voltage, T-peel strength, and thermal resistance were measured in the same methods as in Example 1 except that this circuit board laminate was used. As a result, the withstand voltage was 8.0 kV, peel strength was 7.5 N/cm, and thermal resistance was 0.15° C./W.

EXAMPLE 6

A circuit board laminate was produced in the same method as Example 1 except that the same boron nitride that was used in Example 2 was used in place of aluminum nitride. In this case, the compressibility and porosity were also measured in the same methods as in Example 1. As a result, the compressibility and porosity were 33.3% and 0.1%, respectively.

Further, the withstand voltage, T-peel strength, and thermal resistance were measured in the same methods as in Example 1 except that this circuit board laminate was used. As a result, the withstand voltage was 9.0 kV, peel strength was 5.0 N/cm, and thermal resistance was 0.15° C./W.

EXAMPLE 7

A circuit board laminate was produced in the same method as Example 1 except that aluminum oxide ("AA-5", manufactured by Sumitomo Chemical Co., Ltd., average particle diameter: 5 μm) was used in place of aluminum nitride. In this case, the compressibility and porosity were also measured in the same methods as in Example 1. As a result, the compressibility and porosity were 13.0% and 25.0%, respectively.

Further, the withstand voltage, T-peel strength, and thermal resistance were measured in the same methods as in Example 1 except that this circuit board laminate was used. As a result, the withstand voltage was 1.5 kV, peel strength was 15.9 N/cm, and thermal resistance was 0.26° C./W.

EXAMPLE 8

The same aluminum oxide that was used in Example 7 and the same boron nitride that was used in Example 2 were added to the liquid crystal polyester solution obtained by the above method to prepare a dispersion liquid. Here, aluminum oxide and boron nitride were added such that the proportion of the inorganic filler made of aluminum oxide and boron nitride in the insulation layer obtained from this dispersion liquid was 65% by volume and the BN blend ratio was 25% by volume.

A circuit board laminate was produced in the same method as in Example 1 except, that the dispersion liquid prepared as mentioned above was used. In this case, the compressibility and porosity were also measured in the same methods as in Example 1. As a result, the compressibility and porosity were 17.0% and 13.0%, respectively.

Further, the withstand voltage, T-peel strength, and thermal resistance were measured in the same methods as in Example 1 except that this circuit board laminate was used. As a result, the withstand voltage was 1.5 kV, peel strength was 12.9 N/cm, and thermal resistance was 0.23° C./W.

EXAMPLE 9

A circuit board laminate was produced in the same method as Example 8 except that the BN blend ratio was 35% by volume. In this case, the compressibility and porosity were also measured in the same methods as in Example 1. As a result, the compressibility and porosity were 19.0% and 6.5%, respectively.

Further, the withstand voltage, T-peel strength, and thermal resistance were measured in the same methods as in Example 1 except that this circuit board laminate was used. As a result, the withstand voltage was 4.0 kV, peel strength was 12.3 N/cm, and thermal resistance was 20° C./W.

EXAMPLE 10

A circuit board laminate was produced in the same method as Example 8 except that the BN blend ratio was 50% by volume. In this case, the compressibility and porosity were also measured in the same methods as in Example 1. As a result, the compressibility and porosity were 22.0% and 1.0%, respectively.

Further, the withstand voltage, T-peel strength, and thermal resistance were measured in the same methods as in Example 1 except that this circuit board laminate was used. As a result, the withstand voltage was 8.0 kV, peel strength was 11.1 N/cm, and thermal resistance was 0.17° C./W.

EXAMPLE 11

A circuit board laminate was produced in the same method as Example 8 except that the BN blend ratio was 80% by volume. In this case, the compressibility and porosity were also measured in the same methods as in Example 1. As a result, the compressibility and porosity were 29.0% and 0.5%, respectively.

Further, the withstand voltage, T-peel strength, and thermal resistance were measured in the same methods as in Example 1 except that this circuit board laminate was used. As a result, the withstand voltage was 8.5 kV, peel strength was 7.9 N/cm, and thermal resistance was 0.16° C./W.

The results obtained in Examples 1 to 11 are shown in the following Table 1 and FIGS. 4 to 8.

TABLE 1

| Examples | Inorganic filler (vol %) | | | BN blend ratio (vol %) | Compressibility (%) | Porosity (%) | Withstand voltage (kV) | Peel strength (N/cm) | Thermal resistance (° C./W) |
|---|---|---|---|---|---|---|---|---|---|
| | AlN | Al$_2$O$_3$ | BN | | | | | | |
| 1 | 65.00 | — | — | 0 | 14.6 | 20.0 | 1.5 | 13.6 | 0.20 |
| 2 | 48.75 | — | 16.25 | 25 | 18.0 | 10.8 | 2.0 | 13.1 | 0.18 |
| 3 | 42.25 | — | 22.75 | 35 | 20.0 | 7.0 | 4.0 | 12.3 | 0.17 |
| 4 | 32.50 | — | 32.50 | 50 | 21.7 | 1.3 | 7.0 | 11.6 | 0.16 |
| 5 | 13.00 | — | 52.00 | 80 | 29.0 | 0.5 | 8.0 | 7.5 | 0.15 |
| 6 | — | — | 65.00 | 100 | 33.3 | 0.1 | 9.0 | 5.0 | 0.15 |
| 7 | — | 65.00 | — | 0 | 13.0 | 25.0 | 1.5 | 15.9 | 0.26 |
| 8 | — | 48.75 | 16.25 | 25 | 17.0 | 13.0 | 1.5 | 12.9 | 0.23 |
| 9 | — | 42.75 | 22.75 | 35 | 19.0 | 8.5 | 4.0 | 12.3 | 0.20 |
| 10 | — | 32.50 | 32.50 | 50 | 22.0 | 1.0 | 8.0 | 11.1 | 0.17 |
| 11 | — | 13.00 | 52.00 | 80 | 29.0 | 0.5 | 8.5 | 7.9 | 0.16 |

Figure 4:
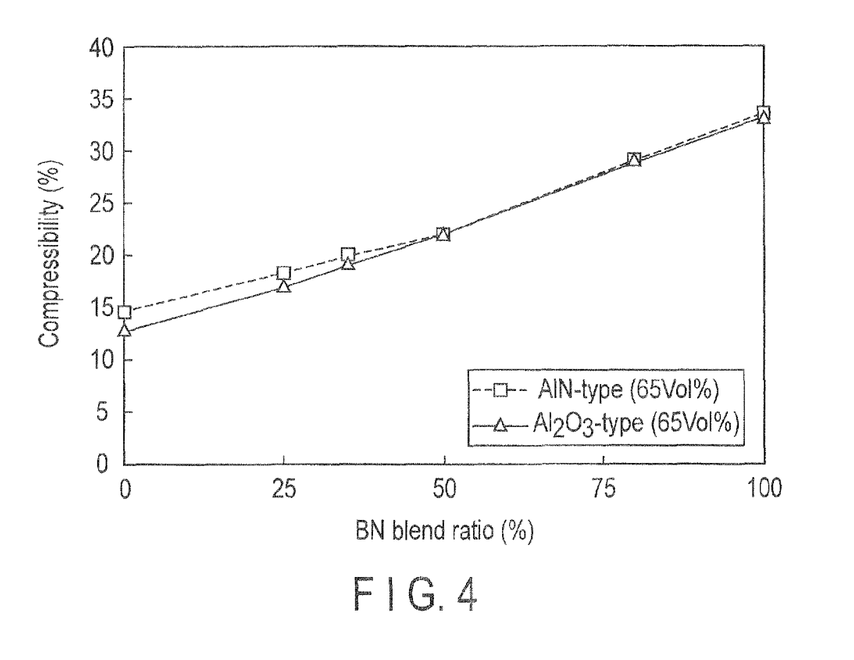
FIG. 4 is a graph showing an example of an influence of a proportion of boron nitride in an inorganic filler on compressibility of an insulation layer.
Figure 5:
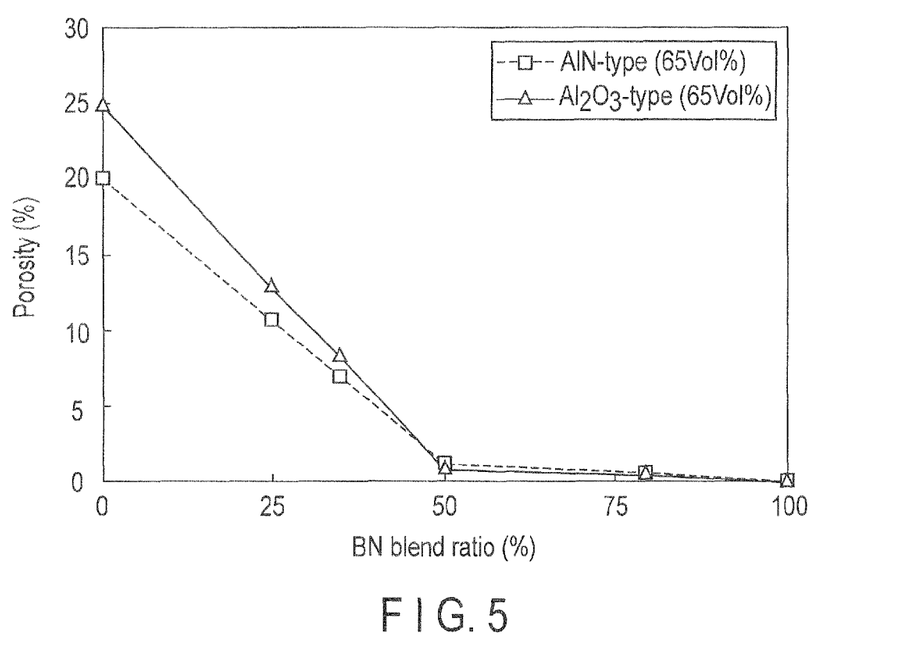
FIG. 5 is a graph showing an example of an influence of the proportion of boron nitride in the inorganic filler on a proportion of pores in the insulation layer.
Figure 6:
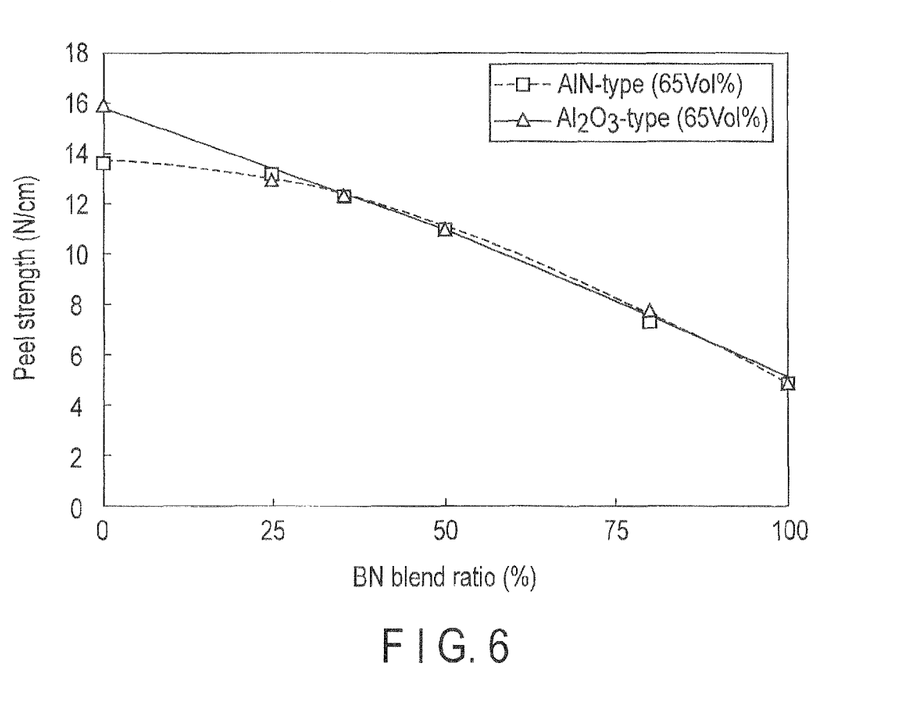
FIG. 6 is a graph showing an example of an influence of the proportion of boron nitride in the inorganic filler on peel strength of a metal foil.
Figure 7:
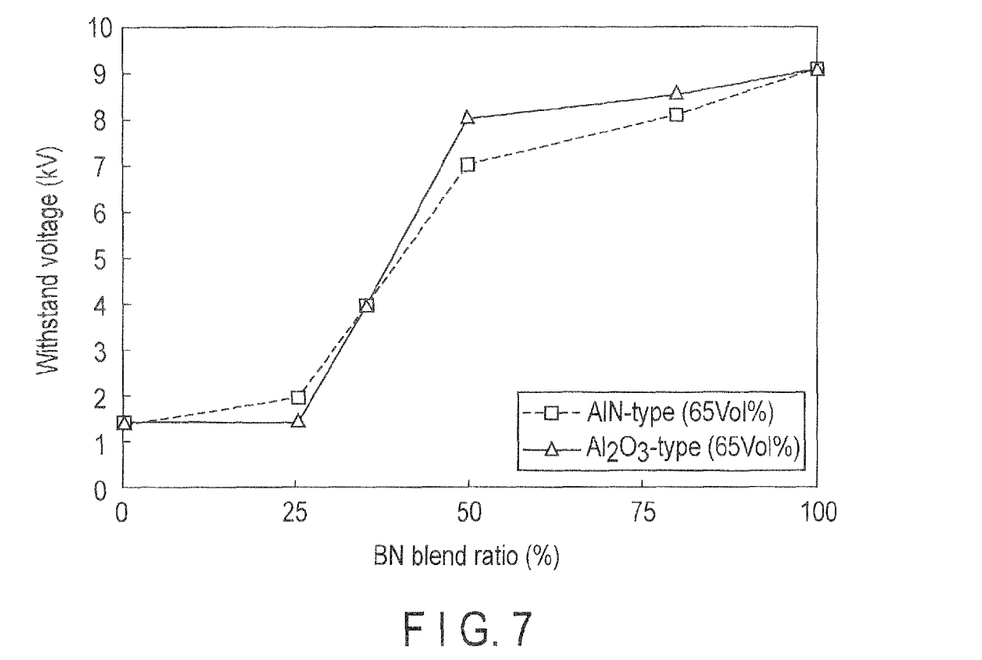
FIG. 7 is a graph showing an example of an influence of the proportion of boron nitride in the inorganic filler on a withstand voltage of a circuit board laminate.
Figure 8:
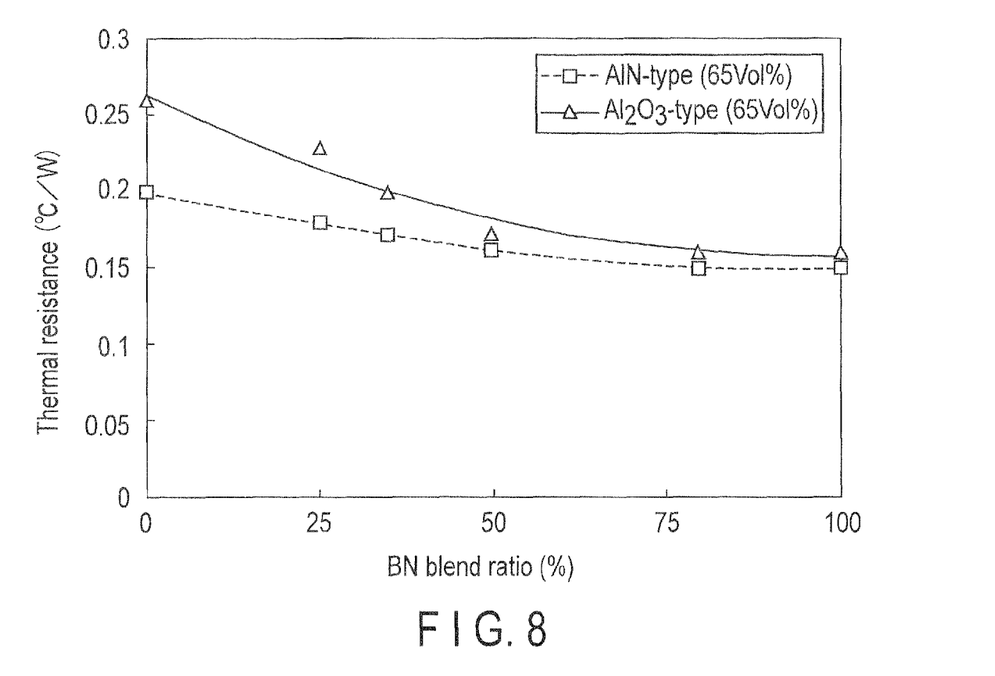
FIG. 8 is a graph showing an example of an influence of the proportion of boron nitride in the inorganic filler on a thermal resistance of the circuit hoard laminate.

FIG. 4 is a graph showing an example of the influence of the proportion of boron nitride in the inorganic filler on the compressibility of the insulation layer. FIG. 5 is a graph showing an example of the influence of the proportion of boron nitride in the inorganic filler on the proportion of pores in the insulation layer. FIG. 6 is a graph showing an example of the influence of the proportion of boron nitride in the inorganic filler on the peel strength of the metal foil. FIG. 7 is a graph showing an example of the influence of the proportion of boron nitride in the inorganic filler on the withstand voltage of the circuit board laminate. FIG. 8 is a graph showing an example of the influence of the proportion of boron nitride in the inorganic filler on the thermal resistance of the circuit board laminate.

When the BN blend ratio was increased, the compressibility increased as shown in FIG. 4 and the porosity decreased as shown in FIG. 5. Specifically, when the BN blend ratio was increased, the compressibility decreased at an almost fixed rate to the increment. Further, when the BN blend ratio was increased, the porosity decreased at an almost fixed rate to the increment when the BN blend ratio was within a range of 0 to 50% by volume and slightly changed with the increment when the BN blend ratio was within a range of 50 to 100% by volume.

As shown in FIG. 6, when the BN blend ratio was increased, the peel strength dropped at an almost fixed rate to the increment. When the BN blend ratio was 80% by volume or less, a peel strength of 7.5 N/cm or more could be attained.

As shown in FIG. 7, the withstand voltage increased when the BN blend ratio was increased. Specifically, although the withstand voltage increased at an almost fixed rate to the increment of the BN blend ratio when the BN blend ratio was within a range of 0 to 25% by volume, the change was small. When the BN blend ratio was within a range of 25 to 50% by volume, the withstand voltage increased at an almost fixed rate to the increment of the BN blend ratio, showing that the rate of rise in withstand voltage to the increment of the BN blend ratio was greater than in the case where the BN blend ratio was within a range of 0 to 25% by volume. Although the withstand voltage increased at an almost fixed rate to the increment of the BN blend ratio when the RN blend ratio was within a range of 50 to 100% by volume, the rate of rise in withstand voltage to the increment of the BN blend ratio was smaller than in the case where the BN blend ratio was within a range of 25 to 50% by volume. The a withstand voltage of 4 kV or more could be achieved when the BN blend ratio was 35% by volume or more, and a withstand voltage of 7 kV or more could be achieved when the BN blend ratio was 50% by volume or more.

As shown in FIG. 8, the thermal resistance decreased when the BN blend ratio was increased. When the BN blend ratio was 35% by volume or more, a thermal resistance of 0.20° C./W or less was achieved when aluminum oxide was used as a part of the inorganic filler and a thermal resistance of 0.17° C./W or less was achieved when aluminum nitride was used as a part of the inorganic filler.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A circuit board laminate comprising:
a metal substrate;
an insulation layer disposed on the metal substrate and containing a liquid crystal polyester and 50% or more by volume of an inorganic filler, the inorganic filler being made of boron nitride having an average particle diameter within a range of 10 to 50 μm and at least one aluminum compound selected from the group consisting of aluminum nitride and aluminum oxide, said aluminum compound having an average particle diameter within a range of 5 to 30 μm, wherein a proportion of boron nitride in the inorganic filler is within a range of 35 to 80% by volume; and
a metal foil disposed on the insulation layer.

2. The circuit board laminate according to claim 1, wherein the liquid crystal polyester has structural units represented by the following formulae (1) to (3), and proportions of the structural units represented by the formulae (1) to (3) are within a range of 30 to 80 mol%, within a range of 10 to 35 mol%, and within a range of 10 to 35 mol %, respectively, based on a total of the structural units represented by the formulae (1) to (3):

wherein Ar1 represents a phenylene group or a naphthylene group, Ar2 represents a phenylene group, a naphthylene group, or a group represented by the following formula (4), Ar3 represents a phenylene group or a group represented by the following formula (4), and X and Y independently represent O or NH, provided that each hydrogen atom bonded to the aromatic ring of Ar, Ar2 and Ar3 may be substituted with a halogen atom, alkyl group, or aryl group:

wherein Ar11 and Ar12 independently represent a phenylene group or a naphthylene group, and Z represents O, CO, or SO$_2$.

3. The circuit board laminate according to claim 1, wherein the proportion of boron nitride in the inorganic filler is within a range of 50 to 80% by volume.

4. The circuit board laminate according to claim 3, wherein the liquid crystal polyester has structural units represented by the following formulae (1) to (3), and proportions of the structural units represented by the formulae (1) to (3) are within a range of 30 to 80 mol%, within a range of 10 to 35 mol%, and within a range of 1 O to 35 mol%, respectively, based on a total of the structural units represented by the formulae (1) to (3):

wherein Ar1 represents a phenylene group or a naphthylene group, Ar2 represents a phenylene group, a naphthylene group, or a group represented by the following formula (4), Ar3 represents a phenylene group or a group represented by the following formula (4), and X and Y independently represent O or NH, provided that each hydrogen atom bonded to the aromatic ring of Ar, Ar2 and Ar3 may be substituted with a halogen atom, alkyl group, or aryl group:

wherein Ar11 and Ar12 independently represent a phenylene group or a naphthylene group, and 2 represents O, CO, or SO$_2$.

5. A metal-based circuit board comprising:
a metal substrate;
an insulation layer disposed on the metal substrate and containing a liquid crystal polyester and 50% or more by volume of an inorganic filler, the inorganic filler being made of boron nitride having an average particle diameter within a range of 10 to 50μm and at least one aluminum compound selected from the group consisting of aluminum nitride and aluminum oxide, said aluminum compound having an average particle diameter within a range of 5 to 30 μm, wherein a proportion of boron nitride in the inorganic filler is within a range of 35 to 80% by volume; and
a circuit pattern disposed on the insulation layer.

6. The metal-based circuit board according to claim 5, wherein the liquid crystal polyester has structural units represented by the following formulae (1) to (3), and proportions of the structural units represented by the formulae (1) to (3) are within a range of 30 to 80 mol%, within a range of 10 to 35 mol%, and within a range of 10 to 35 mol%, respectively, based on a total of structural units represented by the formulae (1) to (3):

—O—Ar1—CO—     (1)

—CO—Ar2—CO—     (2)

—X—Ar3—Y—     (3)

wherein Ar1 represents a phenylene group or a naphthylene group, Ar2 represents a phenylene group, a naphthylene group, or a group represented by the following formula (4), Ar3 represents a phenylene group or a group represented by the following formula (4), and X and Y independently represent O or NH, provided that each hydrogen atom bonded to the aromatic ring of Ar, Ar2, or Ar3 may be substituted with a halogen atom, alkyl group, or aryl group:

—Ar11—Z—Ar12—     (4)

wherein Ar11 and Ar12 independently represent a phenylene group or a naphthylene group, and Z represents O, CO, or SO$_2$.

7. The metal-based circuit board according to claim 5, wherein the proportion of boron nitride in the inorganic filler is within a range of 50 to 80% by volume.

8. The metal-based circuit board according to claim 7, wherein the liquid crystal polyester has structural units represented by the following formulae (1) to (3), and proportions of the structural units represented by the formulae (1) to (3) are within a range of 30 to 80 mol%, within a range of 10 to 35 mol%, and within a range of 10 to 35 mol%, respectively, based on a total of structural units represented by the formulae (1) to (3):

—O—Ar1—CO—     (1)

—CO—Ar2—CO—     (2)

—X—Ar3—Y—     (3)

wherein Ar1 represents a phenylene group or a naphthylene group, Ar2 represents a phenylene group, a naphthylene group, or a group represented by the following formula (4), Ar3 represents a phenylene group or a group represented by the following formula (4), and X and Y independently represent O or NH, provided that each hydrogen atom bonded to the aromatic ring of Ar, Ar2, or Ar3 may be substituted with a halogen atom, alkyl group, or aryl group:

—Ar11—Z—Ar12—     (4)

wherein Ar11 and Ar12 independently represent a phenylene group or a naphthylene group, and Z represents O, CO, or SO$_2$.

* * * * *